United States Patent
Laut

(10) Patent No.: US 6,281,432 B1
(45) Date of Patent: Aug. 28, 2001

(54) SHEET METAL COMPONENT WITH DEPRESSION

(75) Inventor: Marvin Laut, Dracut, MA (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/318,167

(22) Filed: May 25, 1999

(51) Int. Cl.$^7$ ........................................................ H05K 9/00
(52) U.S. Cl. .......................... 174/35 R; 174/35 GC; 361/818
(58) Field of Search .......................... 174/35 R, 35 MS, 174/35 GC; 361/818, 816, 799, 800; 439/939, 92, 95, 927; 277/919, 920; 72/48

(56) References Cited

U.S. PATENT DOCUMENTS

| | | | |
|---|---|---|---|
| 4,717,791 | * | 1/1988 | Mathur ................................ 174/35 R |
| 5,161,997 | * | 11/1992 | Defibaugh et al. .................. 439/532 |
| 5,656,380 | * | 8/1997 | Raber et al. .......................... 428/608 |

FOREIGN PATENT DOCUMENTS

| | | | |
|---|---|---|---|
| 467399 | * | 1/1992 | (EP) . |
| 4-116900 | * | 4/1992 | (JP) . |

\* cited by examiner

Primary Examiner—Dean A. Reichard
Assistant Examiner—Carmelo Oliva
(74) Attorney, Agent, or Firm—McGlew and Tuttle, P.C.

(57) ABSTRACT

A process is provided for providing a metal element and removing portions of the metal at a series of location at a section of the metal element. By removing portions of the metal element a plurality of webs are provided separating the holes where the material has been removed. The webs are subsequently pressed to allow the webs to expand into the region of the holes and to form a depressed region based on the depressed surfaces of each of the webs relative to the surrounding web seat. The resulting product provides a metal piece such as a sheet metal element wherein a groove or depression is formed on one side without any extension or protrusion on the other side. A system is also provided using the metal element in combination with a gasket element and another component. This system provides an effective EMI barrier.

5 Claims, 2 Drawing Sheets

SHEET METAL COMPONENT WITH DEPRESSION

FIELD OF THE INVENTION

The present invention relates generally to metal components and more particularly to electronic device housings made of sheet metal and sheet and support elements used for electronic devices, especially used for electronic devices operating at high frequencies.

BACKGROUND OF THE INVENTION

Support structures and housings made for electronic components are often made of sheet metal. The sheet metal structures can include support elements, housings as well as shielding elements, e.g. elements provided to shield various devices as to electromagnetic emissions that cause electromagnetic interference (EMI).

Electronic devices are being used which operate at very high frequencies. This leads the designer of housings and support structures to increasingly provide systems and components for reducing EMI problems.

Sealing elements are often used for forming an electromagnetic shield. Such sealing elements are typically used at the interfaces between components. This may be for example where a sheet metal component joins with another sheet metal component or where a sheet metal component joins with some other element, including a circuit board. At these interfaces, various different sealing elements may be provided. Other similar elements which function to limit electromagnetic interference problems may also be provided to form an EMI barrier or shield.

In order to increase the functional effect of the shield and/or to provide space for the shield, depressions and grooves may be provided. This is for example to provide a seat for the shield. Besides locating the shield, the depression provides additional space for the shield. Providing depressions in the sheet metal will however reduce space on the opposite side of the depression. This is problematic for various reasons. Such a depression will limit the space adjacent to the depression, at the opposite side of the sealing element.

SUMMARY AND OBJECTS OF THE INVENTION

It is an object of the invention to provide a process for forming a depression in a metal piece such as a sheet metal element without depressing the opposite side of the metal piece.

It is a further object of the invention to provide a sheet metal piece with a depressed region on one side wherein the metal does not protrude outwardly from the other side.

It is a further object of the invention to provide an electronic component and support system which provides sheet metal elements with a sheet metal piece with a depressed region on one side wherein the metal does not protrude outwardly from the other side and which includes sealing elements such as a conductive sealing gasket in the depressed region to reduce electromagnetic interference problems.

According to the invention, a process is provided providing a metal sheet element and removing portions of the sheet metal at a series of locations in a section of the sheet metal element. By removing portions a plurality of webs are provided separating the holes. The webs are subsequently pressed to allow the webs to expand into the region of the holes and to form a depressed region based on the depressed surfaces of each of the webs relative to the surrounding web sheet.

The portions are preferably removed in a series along a section. After the webs are subsequently pressed this can form for example a groove or other depressed region. A gasket element or other device for limiting electromagnetic interference is subsequently provided in the depressed region.

The holes may advantageously be formed using a punch press.

According to another aspect of the invention a metal element is provided with a section including a first surface and a second surface. Plurality of holes are formed in the metal section extending through the metal section from the first surface to the second surface. The holes to define a series of webs separating the holes. The webs have a second surface at a level of the second surface of the metal element and the webs have a first surface which is depressed relative to the first surface of the metal surface by pressing the webs and allowing the webs to expand into the region of the holes to form a depressed region.

The invention also relates to a system using a metal element as noted above wherein a gasket is positioned in the depressed region and an additional element for the surface is placed in close proximity with the first surface of the metal element. The gasket is provided in contact with the additional element to limit the electromagnetic interference from outside of the connection between the metal element and the additional element and from inside to the outside, effectively providing an EMI barrier. The gasket includes a conductive fabric or other conductive surface of a resilient body.

Various different metal elements may be used. Preferably sheet metal is used which may be for example have a thickness in the range of 0.048 in. The holes may advantageously be punched to have a width (HW) of for example 0.180 inch. This is advantageous as to the use of commercially available electromagnetic interference strips. The length (HL) of the hole may advantageously be 0.125 inch. This allows for various sized webs (W) including for example webs of from 0.075 to 0.080 inch. After the pressing of the webs, the surface of the webs is depressed from the surface of the metal element by e.g. 0.030 inch±0.003/.000.

The process is particularly advantageous for forming enclosures such as enclosures for local area network devices, communications devices, telephonic systems, etcetera. The process may be advantageously used to join two sheet metal elements to form either a housing or some other support. Additionally, the process may be employed with a sheet metal piece joined to a circuit board or some other element, e.g. plastic as well as plastic and a mixture of some other materials.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENT

Figure 1:
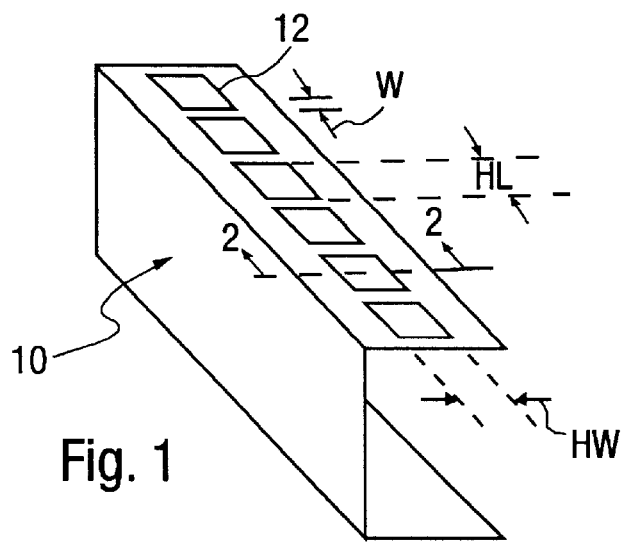
FIG. 1 is a perspective view of a sheet metal element with a plurality of holes punched in a section of the sheet.

Referring to the drawings in particular, the invention comprises a method of providing a depressed section in an element such as a metal element and more particularly a sheet metal element generally designated 10. The sheet metal element 10 may be of various different types but can be for example sheet steel of about 0.048 in. thick. The sheet metal element is suitably bent to form the finished shape. The finished element may be part of a housing or the finished element may function as a support piece. Most advantageously, according to the invention, the finished element forms part of a housing of an electronic device operating at high frequencies (for example up to or above 100 MHz). The metal element may also be a support structure for an electronic device. For example, the metal element may be used as part of a card received in the slot of the housing.

Either before or after the metal piece is shaped, a plurality of holes 12 are punched in the sheet metal piece. A standard punch press may be used or other suitable device for forming the holes. The holes are provided in a section of the metal element which section is to be used for electromagnetic sealing or shielding. The section may be for example a straight line, a curved line or the section may form lines at an angle (a corner). Such a section may be provided along a sealing edge. The section may also be in other shapes.

Figure 2:
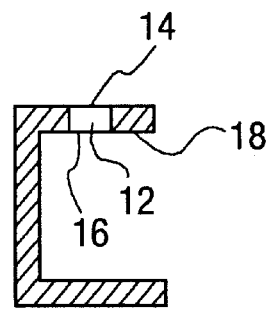
FIG. 2 is a cross-sectional view of FIG. 1 taken along line 2—2 of FIG. 1.

By providing a series of holes along the section a series of webs 14 are provided. The webs 14 are between the various holes 12. FIG. 1 shows the series of holes 12 and the series of webs 14. FIG. 2 shows one hole 12, based on the cross-sectional view taken along line 2—2 of FIG. 1.

Using the sheet metal element 10 it is advantageous to form the holes or openings 12 to have a length dimension (along the direction of the series of holes) of 0.125 inch and to provide a width of 0.180 inch. Although these dimensions are advantageous, other dimensions are possible. It is also advantageous to provide the webs 14 to have a width of 0.075 to 0.080 inch.

Figure 3:
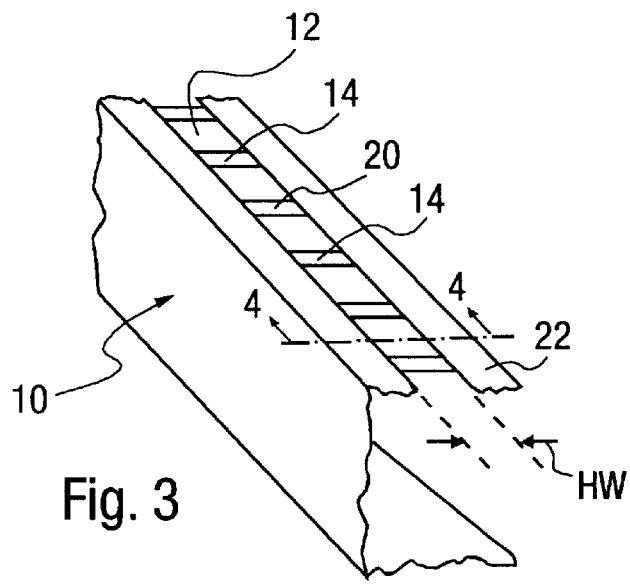
FIG. 3 is a perspective view of a sheet metal element after a coining step which forms strips of metal having an upper surface level which is lower (depressed) relative to the sheet surface at the same side.
Figure 4:
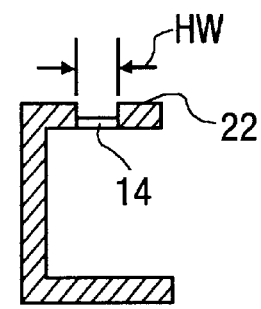
FIG. 4 is a cross-sectional view taken along line 4—4 of FIG. 3.

The process provides that the web elements 14 are subsequently subjected to a coining process. Specifically, the webs, which are relatively narrow, are pressed (compressed or coined). The compressing action is provided such that it does not allow the surface 16 of the web 14 to move relative to the adjacent surface 18 of the remaining element 10. However the surface 20 of the webs is depressed relative to the adjacent surface 22 of the metal element 10. This depressed surface 20 is shown in FIG. 3. The depressed surface 20 is depressed relative to surface 22 of the metal element 10 by e.g. 0.030 inch+0.003 inch−0.000 inch. The coining or pressing process forces the material of the narrow webs to expand into the region of the punched holes. The result is the depressed surface area 20 relative to the metal surface 22, with the expanding webs filling in a portion of the punch-out area. With the dimensions discussed above, most of the punched out areas are filled so as to provide a depressed channel section or groove 24 which may be used to receive a sealing element as discussed further below.

Figure 5:
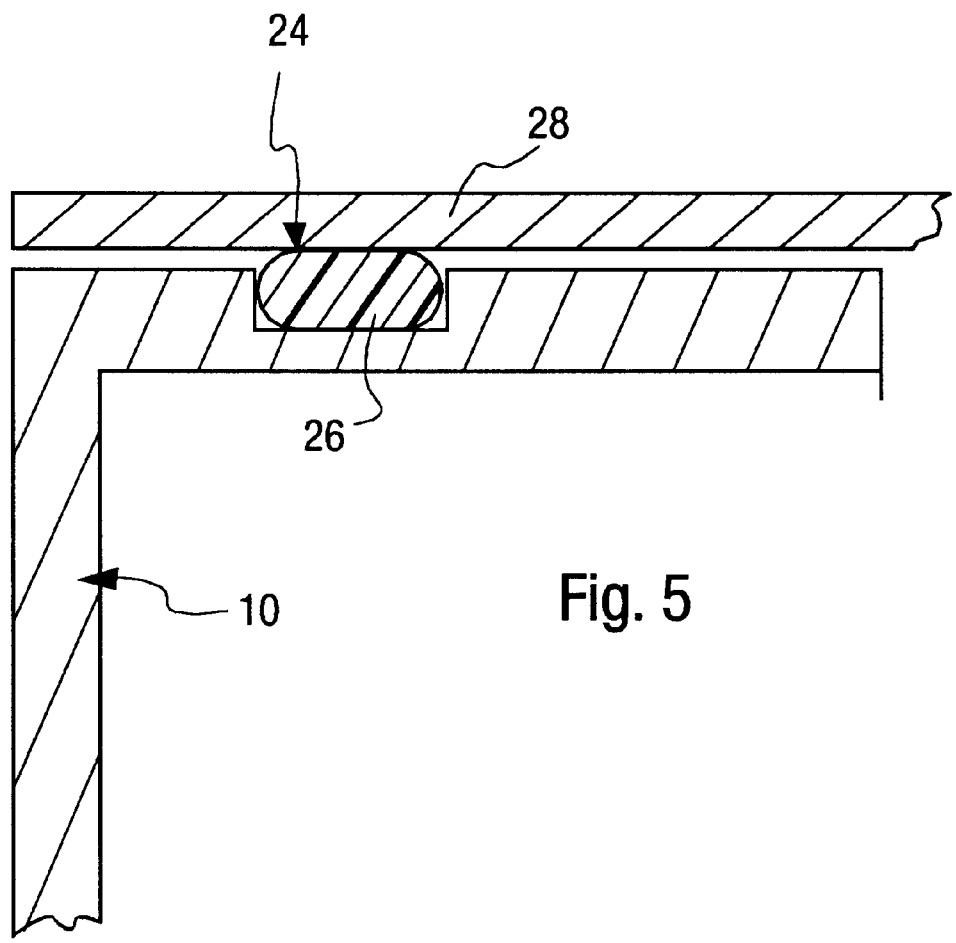
FIG. 5 is a cross-sectional view showing a system forming an EMI barrier according to the invention.

FIG. 5 shows a reduced electromagnetic emissions assembly system including the sheet metal element 10 with a depressed channel section 24 formed as discussed above. This provides a mounting seat for an EMI gasket 26. Another element 28 is suitably connected to form a reduced EMI system. In the reduced EMI system the gasket 26 is seated in the depressed channel section 24 sandwiched between the sheet metal element 10 and the adjacent element 28. This provides a suitable EMI barrier.

While specific embodiments of the invention have been shown and described in detail to illustrate the application of the principles of the invention, it will be understood that the invention may be embodied otherwise without departing from such principles.

What is claimed is:

1. A metal element, comprising:

an integral metal section including a first surface and a second surface with a plurality of holes formed in the metal section extending through said metal section from said first surface to said second surface, a series of webs separating said holes, said webs having a second surface at a level of said second surface of said metal section and said webs having a first surface which is depressed relative to said first surface of said metal section by pressing said webs and allowing the webs to expand to provide expanded webs and reduced dimension holes to provide a depressed region.

2. A metal element according to claim 1, wherein said holes are produced using a punch press.

3. A reduced electromagnetic emissions assembly system, comprising:

a metal element with a metal section including a first surface and a second surface;

a plurality of holes formed in the metal section extending through said metal section from said first surface to said second surface, a series of webs separating said holes, said webs being integral with a remainder of said metal section and having a web second surface at a level of said second surface of said remainder of said metal section and said webs having a web first surface which is depressed relative to said first surface of said metal section by pressing said webs and allowing the webs to expand into the region of the holes to form a depressed region;

a gasket positioned in said depressed region; and an additional element with a surface placed in close proximity with said first surface of said metal element with said gasket in contact with said additional element to limit electromagnetic interference from outside of a connection between said metal element and said additional element and from inside the connection between said metal element and said additional element.

4. A metal element, comprising:

a metal section including a first surface and a second surface with a series of adjacent holes formed in the metal section, each hole extending through said metal section from a sealing side surface to an opposite surface, a series of webs separating said holes, said webs having a back side surface at a level of said opposite surface and said webs having a depression surface providing a depressed region relative to said sealing side surface, said webs being integral with a remainder of said metal section and being pressed to provide expanded webs of reduced thickness compared to said remainder of said metal section and to provide reduced dimension holes, the expanded webs of reduced thickness and series of holes defining said depressed region.

5. A metal element according to claim 4, wherein said holes are produced using a punch press.

* * * * *